United States Patent
Fukuda et al.

(10) Patent No.: US 7,442,913 B2
(45) Date of Patent: Oct. 28, 2008

(54) PHOTOCURRENT AMPLIFIER CIRCUIT AND OPTICAL PICK-UP DEVICE

(75) Inventors: Hideo Fukuda, Kyoto (JP); Shinichi Miyamoto, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 135 days.

(21) Appl. No.: 11/501,822

(22) Filed: Aug. 10, 2006

(65) Prior Publication Data

US 2007/0045519 A1 Mar. 1, 2007

(30) Foreign Application Priority Data

Aug. 24, 2005 (JP) ............................. 2005-243327

(51) Int. Cl.
*G11B 7/13* (2006.01)
*H03F 3/45* (2006.01)

(52) U.S. Cl. ................. 250/214 A; 330/252; 369/47.25; 369/134

(58) Field of Classification Search ............. 250/214 R, 250/214 A, 214 LA, 214 LS, 214.1, 214 SW; 369/134, 47.25; 327/514; 360/46, 67, 68; 330/250, 252, 254, 260, 271, 278
See application file for complete search history.

(56) References Cited

U.S. PATENT DOCUMENTS 6,480,042 B2 * 11/2002 Kadowaki ................... 327/103

7,002,881 B2 2/2006 Okuda et al.
2003/0231574 A1 * 12/2003 Okuda et al. ............ 369/124.12

FOREIGN PATENT DOCUMENTS

JP 2004-22051 1/2004

* cited by examiner

*Primary Examiner*—John R Lee
(74) *Attorney, Agent, or Firm*—Wenderoth, Lind & Ponack, L.L.P.

(57) ABSTRACT

A photocurrent amplifier circuit is capable of selectively amplifying one or more of photocurrents which are respectively obtainable from plural receiving devices, and can be realized to have a small size. The photocurrent amplifier circuit includes: light receiving devices; amplifier devices associated with the light receiving devices; device selector switches which apply input voltages, which inactivate the amplifier devices, to the associated amplifier devices; and a differential amplifier circuit having an inverting input unit configured by the amplifier devices which are connected in parallel. The inputs of the amplifier devices and the output of the differential amplifier circuit are connected by gain resistances. The differential amplifier circuit amplifies, into voltage signals, photocurrents flowing from the light receiving devices which respectively associated with the gain resistances.

8 Claims, 10 Drawing Sheets

PHOTOCURRENT AMPLIFIER CIRCUIT AND OPTICAL PICK-UP DEVICE

BACKGROUND OF THE INVENTION (1) Field of the Invention

The present invention relates to a photocurrent amplifier circuit and an optical pick-up device in which a photocurrent amplifier circuit is used, and particularly to a technique which realizes a simple and downsized photocurrent amplifier circuit.

(2) Description of the Related Art

Optical disc media such as Compact discs (CDs) and Digital Versatile discs (DVDs) have been widely used for recording is digital information represented by video and audio which requires a large capacity. In order to read and/or write information from and/or on these various types of optical disc media (hereinafter simply referred to as media), as commonly known, laser lights with different wavelengths are used in accordance with the types of such media.

A conventional downsized optical pick-up device which is compliant with any of CDs and DVDs typically includes a two-wavelength semiconductor laser device which is used as a light source and a single optical system which is used in common for both the wavelengths of the laser lights. Subsequently, through the optical system, the respective lasers are projected onto points, on the medium, which are different for each of the wavelengths which are dependent on the distance of the emitting points of the lasers having the respective wavelengths. By performing photo-electric conversion of the light reflected from the medium using light receiving devices which are set for the respective wavelengths, an electric signal is obtained, amplified and outputted.

A well-known light receiving amplifier device which is suitable for an optical pick-up device like this is a light receiving amplifier device configured by differential amplifiers which are set for individual light receiving devices with different wavelengths and an output amplifier which selectively amplifies one of the outputs (for example, refer to FIG. 3 and FIG. 4 of Patent Reference 1: Japanese Laid-Open Patent No. 2004-22051).

However, with a conventional light receiving amplifier device, there is a problem that it is difficult to downsize a circuit because differential amplifiers are set for individual light receiving devices with different wavelengths.

This problem is serious especially in the case of wishing to further downsize an optical pick-up device with present functions or wishing to realize a simple and downsized three-wavelength is optical pick-up device which is compliant with not only CDs and DVDs but also Blu-ray Discs (BDs) with a memory capacity bigger than those of CDs and DVDs.

The present invention has been conceived considering the above-described problem, and aims to provide a photocurrent amplifier circuit which selectively amplifies one or more of the photocurrents obtained from a plurality of light receiving devices, and can be realized to be simple and downsized.

SUMMARY OF THE INVENTION

In order to solve the above-problem, the photocurrent amplifier circuit, of the present invention, includes: a differential amplifier circuit which is configured to have an input unit including amplifier devices which are connected in parallel; device selector switches, each of which is set for an associated one of the amplifier devices and applies an input voltage, inactivating the amplifier device, to the associated amplifier device; gain resistors each of which is connected between the input of an associated one of the amplifier devices and the output of the differential amplifier circuit; and light receiving devices, each of which is set for an associated one of the amplifier devices and causes a photocurrent in accordance with an amount of received light. In the photocurrent amplifier circuit, the photocurrent flowing from each light receiving device into an associated one of the gain resistors is amplified into a voltage signal by the differential amplifier circuit.

With this configuration, inactivated amplifier devices are equivalently open. Photocurrents which are flowed from light receiving devices associated with the other amplifier devices are amplified by the single differential amplifier circuit. This photocurrent amplifier circuit is realized by setting amplifier devices for the respective light receiving devices in an inverting input unit of the differential amplifier circuit and device selector switches. Therefore, the space for the circuit part needed for the respective light receiving devices is restricted to a small space. As the result, it becomes possible to realize a simple and downsized photocurrent amplifier circuit which selectively amplifies one or more of the photocurrents which occur in the plurality of light receiving devices.

In addition, the photocurrent amplifier circuit may further include load control circuits, each of which is configured to have a load resistance and a load short switch connected in parallel. The load control circuit is connected in series with an associated one of the gain resistors and is set between the output of the differential amplifier circuit and the input of an associated one of the amplifier devices.

In addition, in the photocurrent amplifier circuit, it is preferable that each load resistance has a value which is greater than the value of the gain resistor which is connected in series with the load resistance.

With this configuration, it is possible to keep internal output loss small by: short-circuiting a load short switch associated with an amplifier device which is performing amplification operation so as to amplify the photocurrent at an amplification rate which is determined depending on a gain resistor; and opening the load short switch associated with the inactivated amplifier device so as to insert a load resistor.

In addition, in the photocurrent amplifier circuit, it is preferable that the width of each load resistor on a semiconductor chip is less than the width of the gain resistor which is connected in series with the load resistance.

As for a resistor formed on a semiconductor chip, generally, such resistance has a nature that the parasitic capacity becomes smaller but the resistance value becomes difficult to be accurate, as the width gets narrower. Therefore, with this configuration, generating a narrow load resistance whose accuracy requirement is comparatively low compared with that of a gain resistance which requires a high accuracy requirement makes it easier to obtain both a reduction in the parasitic capacity and accuracy in the resistance value.

In addition, in each connection of the load control circuit and the gain resistance in the photocurrent amplifier circuit, it is preferable that a same value is obtainable through addition of the value of the load resistor and the value of the gain resistor which is connected in series with the load resistance.

With this configuration, it is possible to keep the internal output loss substantially constant. Therefore, designing of a circuit for external connection is streamlined.

In addition, the photocurrent amplifier circuit may further include photocurrent short switches each of which is connected to both ends of an associated one of the light receiving devices.

With this configuration, it is possible to make a photocurrent which is not an amplification target flow into the photocurrent short switch by short-circuiting the photocurrent short switch associated with the inactivated amplifier device. This makes it possible to avoid a change in output voltage which occurs when the photocurrent which is not an amplification target flows from the outputs of the gain resistor and load resistor. Therefore, a highly accurate output voltage can be obtained.

In addition, the photocurrent amplifier circuit may further include: photocurrent supply switches, each of which is connected between (a) an associated one of the light receiving devices and (b) one of the power source and the ground; and rectifier devices, each of which is connected between (a) a connection point of each light receiving device and an associated one of the photocurrent supply switches and (b) the input of the amplifier device associated with the light receiving device so that is the rectifier device is connected in a reverse direction with respect to a photocurrent to be supplied from the photocurrent supply switch.

With this configuration, it is possible to supply a photocurrent which is not an amplification target from the photocurrent short switch by short-circuiting the photocurrent short switch associated with the inactivated amplifier device. This makes it possible to avoid a change in output voltage which occurs when the photocurrent which is not an amplification target flows from the outputs of the gain resistance and load resistance. Therefore, a highly accurate output voltage can be obtained.

The present invention can be realized not only as a photocurrent amplifier circuit like this but also as a differential amplifier circuit, an optical pick-up device provided with a photocurrent amplifier circuit like this and the like.

With the photocurrent amplifier circuit of the present invention, only the photocurrent associated with the amplifier device which has not been subjected to application of an input voltage to inactivate the amplifier device is selectively amplified by a single differential amplifier circuit. This photocurrent amplifier circuit is realized by setting amplifier devices for the respective light receiving devices and device selector switches in the inverting input unit of the differential amplifier circuit. Therefore, the space for the circuit part needed for the respective light receiving devices is restricted to a small space. As a result, it becomes possible to realize a simple and downsized photocurrent amplifier circuit which selectively amplifies one or more of the photocurrents which occur in the light receiving devices.

FURTHER INFORMATION ABOUT TECHNICAL BACKGROUND TO THIS APPLICATION

The disclosure of Japanese Patent Application No. 2005-243327 filed on Aug. 24, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Embodiments of the present invention will be described is below with reference to the drawings.

First Embodiment

Figure 1:
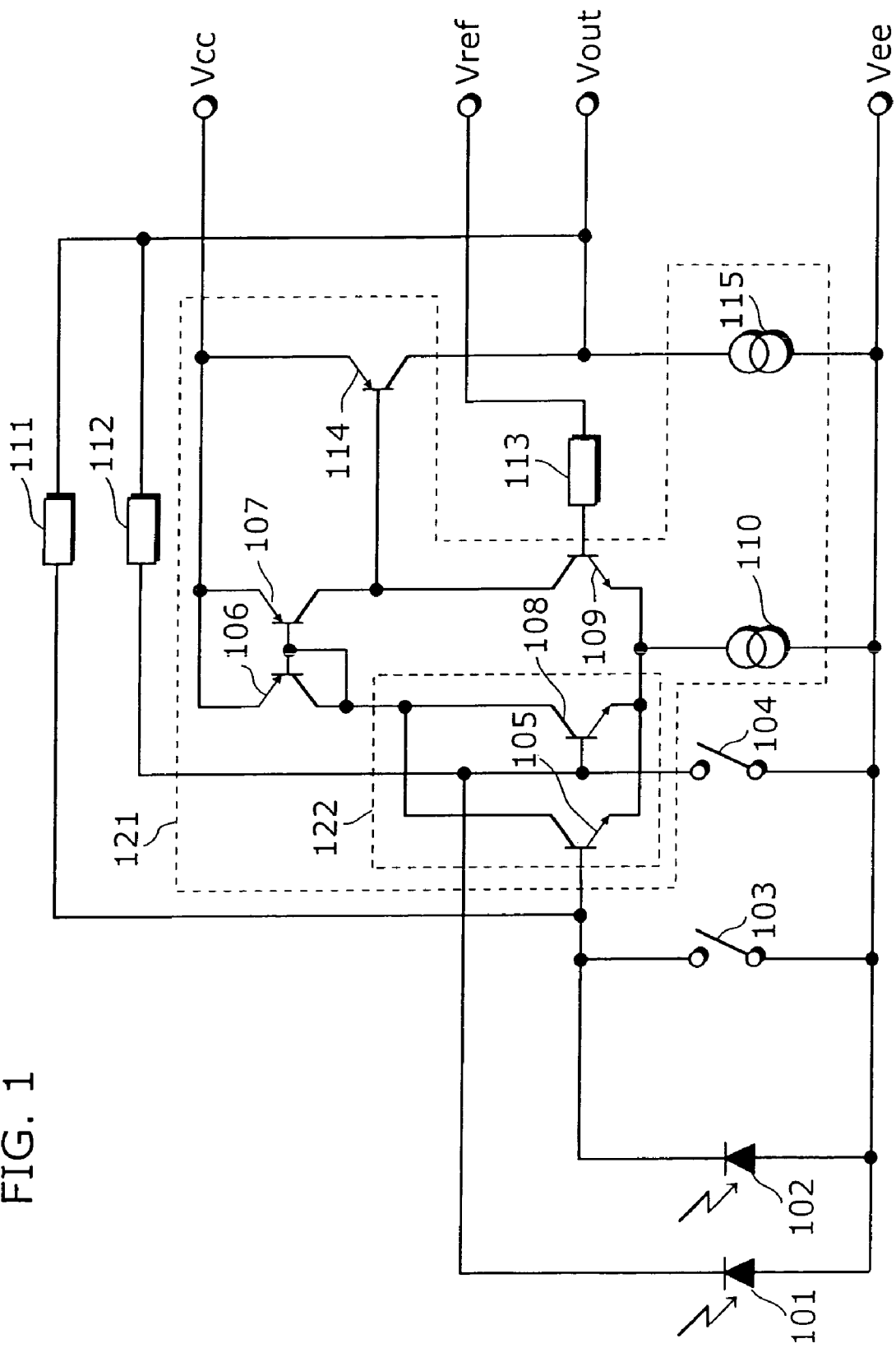
FIG. 1 is a circuit diagram showing an example of a photocurrent amplifier circuit of a first embodiment.

FIG. 1 is a circuit diagram showing an example of a photocurrent amplifier circuit of a first embodiment.

This photocurrent amplifier circuit is configured by: light receiving devices 101 and 102, device selector switches 103 and 104, NPN transistors 105, 108 and 109, PNP transistors 106, 107 and 114, constant power sources 110 and 115, gain resistors 111 and 112, and a non-inverting input resistance 113.

Here, the NPN transistors 105, 108 and 109, the PNP transistors 106, 107 and 114, and the constant power sources 110 and 115 constitute a differential amplifier circuit 121. Particularly, the NPN transistors 105 and 108 are examples of amplifier devices which are respectively set in association with the light receiving devices 102 and 101. They are connected in parallel and constitute an inverting input unit 122 of the differential amplifier circuit 121.

The gain resistors 111 and 112 are feedback resistors inserted into a negative feedback circuit of the differential amplifier circuit 121. They supply, from the output of the differential amplifier circuit 121, the photocurrents of the respective light receiving devices 102 and 101. In accordance with the characteristics of the light receiving devices 102 and 101, the gain resistors 111 and 112 are determined to have such resistance values that can provide favorable amplification rates for the photocurrents.

The device selector switches 103 and 104 are selectively turned on, and a negative power voltage $V_{ee}$ is applied to the bases of the NPN transistors 105 and 108 which are associated with the respective device selector switches 103 and 104. This negative power voltage $V_{ee}$ is an example of an input voltage which inactivates the NPN transistors 105 and 108.

Among the NPN transistors 105 and 108, the inactivated one becomes opened equivalently, and the other one becomes active and performs amplification. In this way, the differential amplifier circuit 121 amplifies the photocurrent, which flows into the gain resistance associated with the active one, into a voltage signal, and outputs the amplified voltage signal. The active one is the one among the NPN transistors 105 and 108 which performs an amplification operation, that is, the one associated with the device selector switch which is currently being turned off.

For example, this photocurrent amplifier circuit may be used in a light receiving unit in a simple and downsized optical pick-up device which is capable of reading and/or writing information from and/or on a CD or a DVD using lights having respectively different wavelengths.

Figure 2:
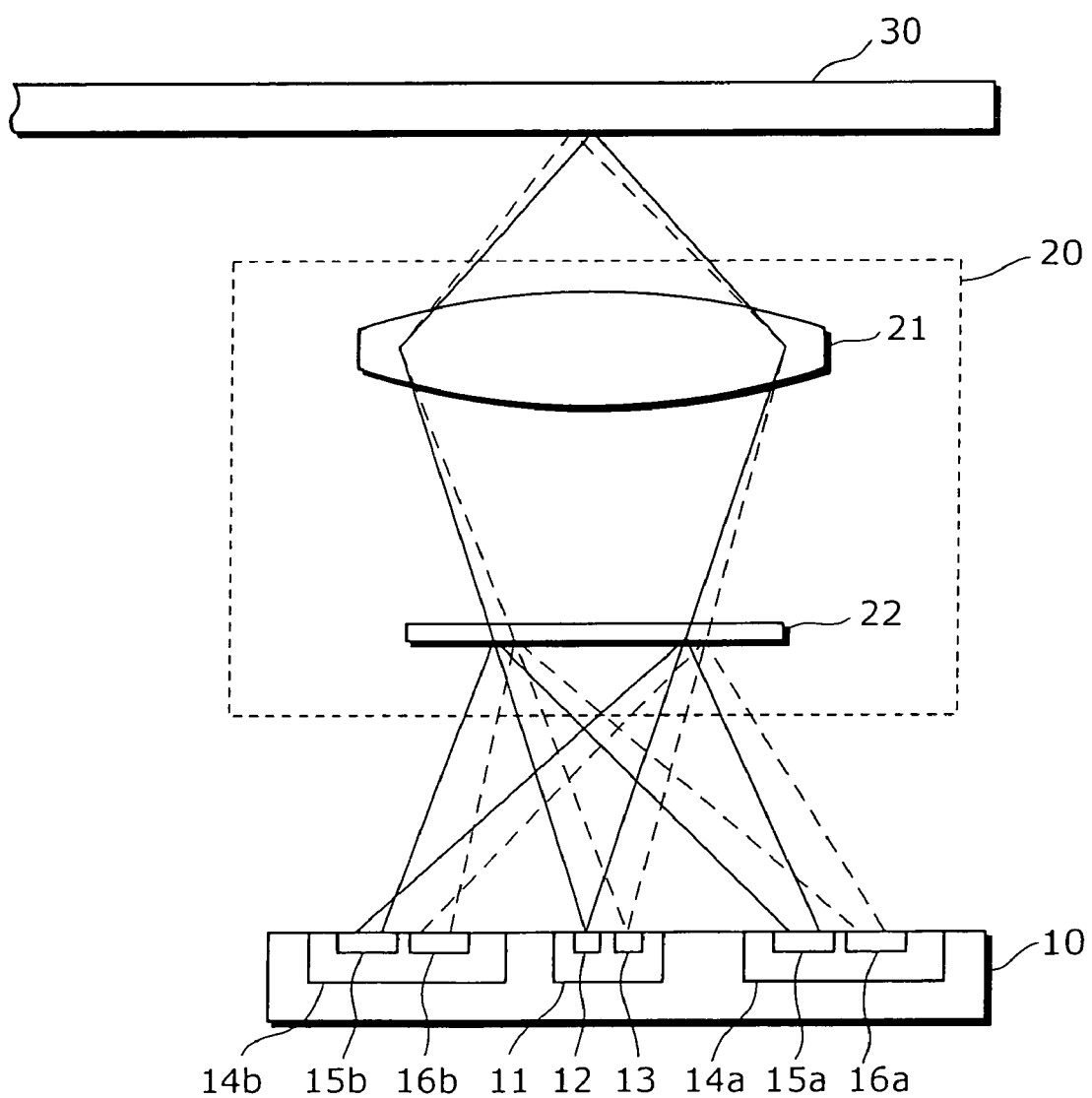
FIG. 2 is a diagram schematically showing an example of a typical configuration of an optical pick-up device.

FIG. 2 is a diagram schematically showing an example of a typical configuration of an optical pick-up device like this. This optical pick-up device is configured by a semiconductor substrate 10 and an optical system 20 which is used in common for a CD and a DVD. Further, a medium 30 is depicted in FIG. 2.

On the semiconductor substrate 10, a light emitting unit 11 and light receiving units 14a and 14b are formed. The optical system 20 is configured by an object lens 21 and a hologram device 22.

For example, the light emitting unit 11 is a two-wavelength semiconductor laser device on which light emitting points 12 and 13 are formed apart. The respective light emitting points 12 and 13 emit an infrared laser light for CDs and a red laser light for DVDs. In FIG. 2, light paths of the infrared laser light and the red laser light are respectively shown by a solid line and a broken line.

The lights having the respective wavelengths emitted from the light emitting unit 11 pass through the object lens 21, are reflected on the medium 30, are divided in the radial direction of the is medium 30 by its hologram device 22, and are projected on the light receiving devices 15a and 16a and the light receiving devices 15b and 16b. The light receiving devices 15a and 16a are set at different positions for the respective wavelengths in the light receiving units 14a, and the light receiving devices 15b and 16b are set at different positions for the respective wavelengths in the light receiving units 14b.

As commonly known, the diameters of the projection spots of the respectively divided reflected lights and imbalance in the light amounts are used for control of focusing and tracking. In addition, the total light amount of the respectively reflected lights is used for reading the information.

The photocurrent amplifier circuit shown in FIG. 1 is set at, for example, each of the light receiving units 14a and 14b in this optical pick-up device. Assuming that the respective light receiving devices 101 and 102 are intended for CDs and DVDs, the respective light receiving devices 101 and 102 are the light receiving devices 15a and 16a in the light receiving unit 14a, and the respective light receiving devices 101 and 102 are the light receiving devices 15b and 16b in the light receiving unit 14b.

Accordingly, the device selector switch 103 is turned off and the device selector switch 104 is turned on for CDs, and the device selector switch 103 is turned off and the device selector switch 104 is turned on for DVDs. In this way, depending on the use for CDs or DVDs, the one, among the NPN transistors 105 and 108, which is compliant with the use performs an amplification operation and the other one is opened equivalently. Therefore, the photocurrent from a desired light receiving device is correctly amplified.

As described above, the photocurrent amplifier circuit of the present invention is configured by using a circuit shared by the respective light receiving devices, although amplification devices and device selector switches for the respective light receiving devices are set in the inverting input unit 122 of the differential amplifier circuit 121. Therefore, it is possible to realize a simple and downsized photocurrent amplifier circuit which selectively amplifies one or more photocurrents which occur in a plurality of light receiving devices.

Note that the photocurrent amplifier circuit having the same features can be configured also by exchanging the NPN transistors and the PNP transistors.

Figure 3:
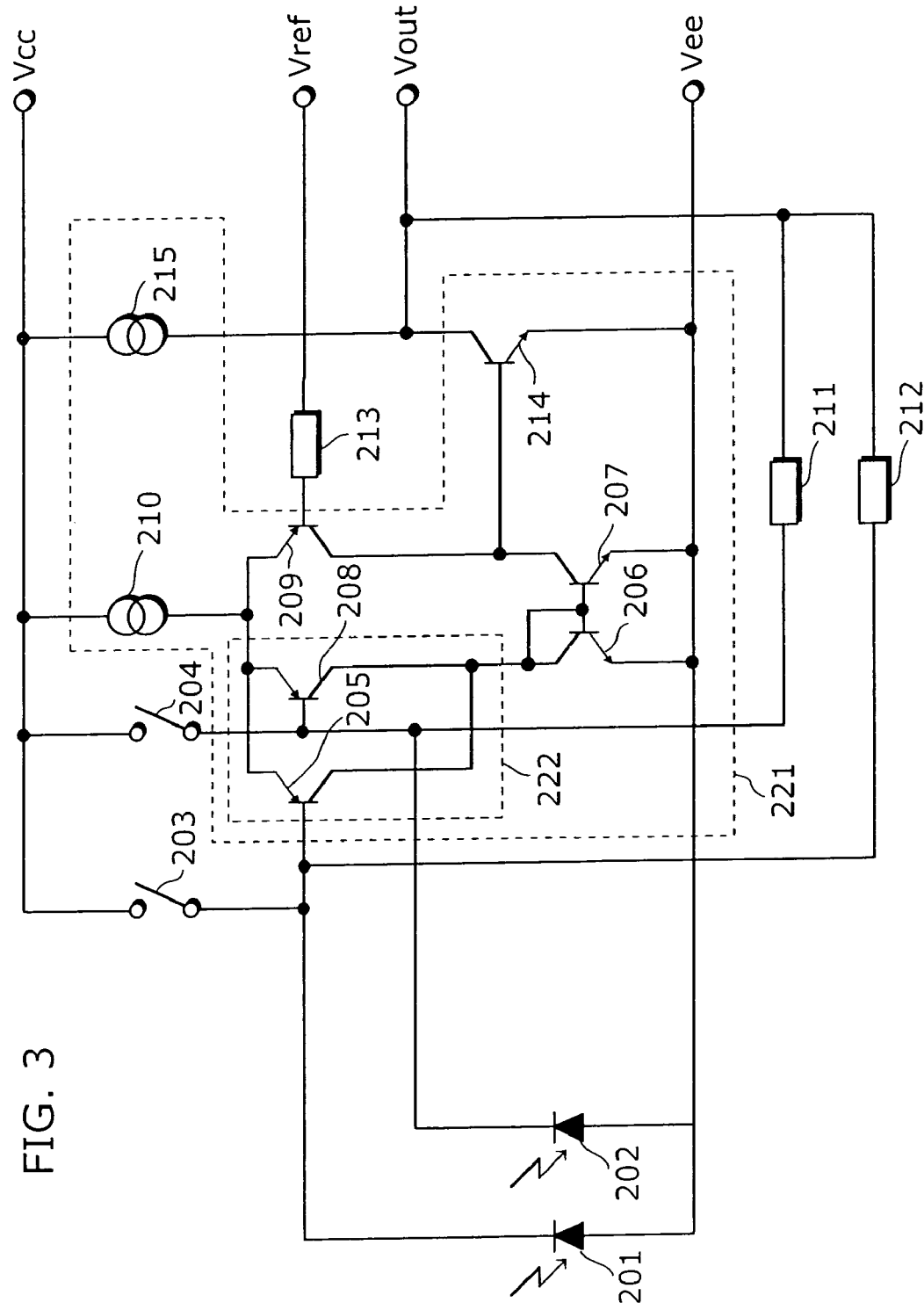
FIG. 3 is a circuit diagram showing an example of a photocurrent amplifier circuit of the first embodiment.

FIG. 3 is a circuit diagram showing an example of a photocurrent amplifier circuit like this. This photocurrent amplifier circuit is configured by light receiving devices 201 and 202, device selector switches 203 and 204, PNP transistors 205, 208 and 209, NPN transistors 206, 207 and 214, constant power sources 210 and 215, gain resistors 211 and 212, and a non-inverting input resistance 213.

Here, the PNP transistors 205, 208 and 209, and the NPN transistors 206, 207 and 214, and the constant power sources 210 and 215 constitute the differential amplifier circuit 221. Particularly, the PNP transistors 205 and 208 are connected in parallel, and constitute the inverting input unit 222 of the differential amplifier circuit 221.

The gain resistances 211 and 212 are feedback resistors inserted in the negative feedback circuits which are set for individual inverting input of the differential amplifier circuit 221, and supply the photocurrents of the respective light receiving devices 202 and 201, from the output of the differential amplifier circuit 221. In accordance with the characteristics of the light receiving devices 202 and 201, the gain resistors 211 and 212 are determined to have such resistance values that can provide favorable amplification rates for the photocurrents.

The device selector switches 203 and 204 are selectively is turned on, and a positive power voltage $V_{cc}$ is applied to the bases of the PNP transistors 205 and 208 which are respectively associated with the device selector switches 203 and 204. This positive power voltage $V_{cc}$ is an example of an input voltage which inactivates the PNP transistors 205 and 208.

The inactivated one of the PNP transistors 205 and 208 becomes opened equivalently, and the other one becomes active and performs an amplification operation. In this way, the differential amplifier circuit 221 amplifies the photocurrent flowing into the gain associated with the active transistor into a voltage signal and outputs the amplified voltage signal. The active transistor is the one which performs an amplification operation, that is, the one associated with the device selector switch which is currently being turned off.

This photocurrent amplifier circuit is also configured by a circuit shared by the respective light receiving devices, although amplification devices and device selector switches for the respective light receiving devices are set in the inverting input unit 222 of the differential amplifier circuit 221. Consequently, the space for the circuit which is needed for the respective light receiving devices is restricted to small space. Therefore, it is possible to realize a simple and downsized photocurrent amplifier circuit which selectively amplifies one or more photocurrents which occur in the light receiving devices.

Second Embodiment

Figure 4:
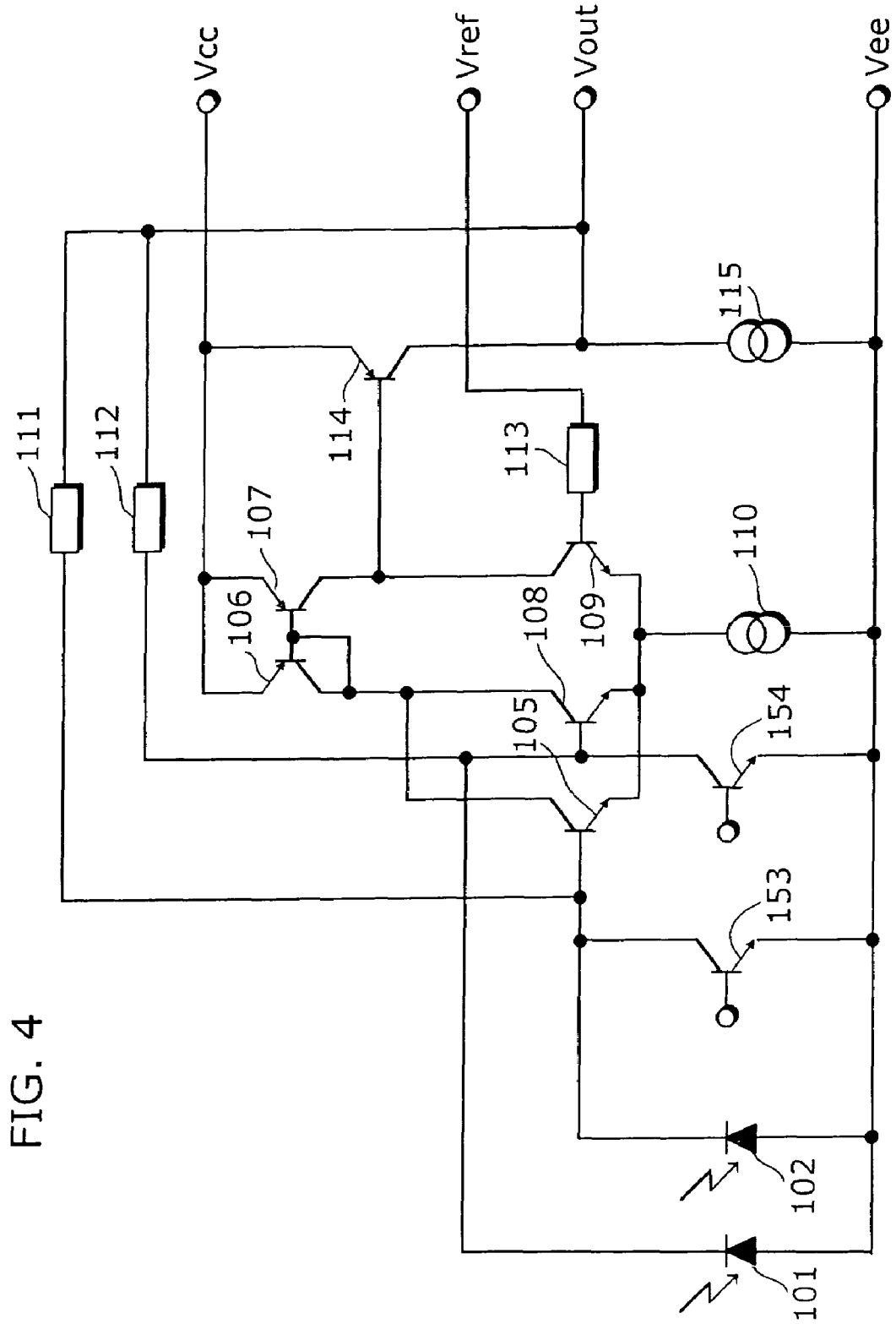
FIG. 4 is a circuit diagram showing an example of a photocurrent amplifier circuit of a second embodiment.

FIG. 4 is a circuit diagram showing an example of the photocurrent amplifier circuit of a second embodiment of the present invention.

This photocurrent amplifier circuit in which the respective device selector switches 103 and 104 in the photocurrent amplifier circuit (refer to FIG. 1) of the first embodiment are realized as NPN transistors 153 and 154.

Here, it is possible to switch the states of the NPN transistors 105 and 108 between an inactivated state and an active state by controlling at least one of the current to be injected and the voltage to be applied to the bases of the respectively associated NPN transistors 153 and 154.

In order to inactivate the NPN transistor 105 in accordance with the base current to be injected to the NPN transistor 153, it is required to inject a base current which causes such collector current that triggers a voltage drop which occurs in the gain resistance 111, which results in making the collector voltage (that is, the base voltage of the NPN transistor 105)

lower than the emitter voltage of the NPN transistor 105. Note that the voltage lower than the emitter voltage of the NPN transistor 105 is an example of an input voltage which inactivates the NPN transistor 105.

In addition, in order to activate the NPN transistor 105, it is required to inject, into the NPN transistor 153, the base current which causes such collector current which is enough to prevent the collector voltage of the NPN transistor 153 from becoming lower than the emitter voltage of the NPN transistor 105. At this time, a specific value of the base current may be determined as, for example, 0A or below (in other words, the base current is pulled or not flowed.

On the other hand, in order to inactivate the NPN transistor 105 in accordance with the base voltage to be applied to the NPN transistor 153, it is required to apply the base voltage which saturates the NPN transistor 153. Additionally, in order to activate the NPN transistor 105 in accordance with the base voltage to be applied to the NPN transistor 153, it is required to apply the base voltage which inactivates the NPN transistor 153.

Note that it is obvious that there is the same relationship between the NPN transistor 154 and the NPN transistor 108.

In addition, the photocurrent amplifier circuit having the same features can be configured also by exchanging the NPN transistor and the PNP transistor.

Figure 5:
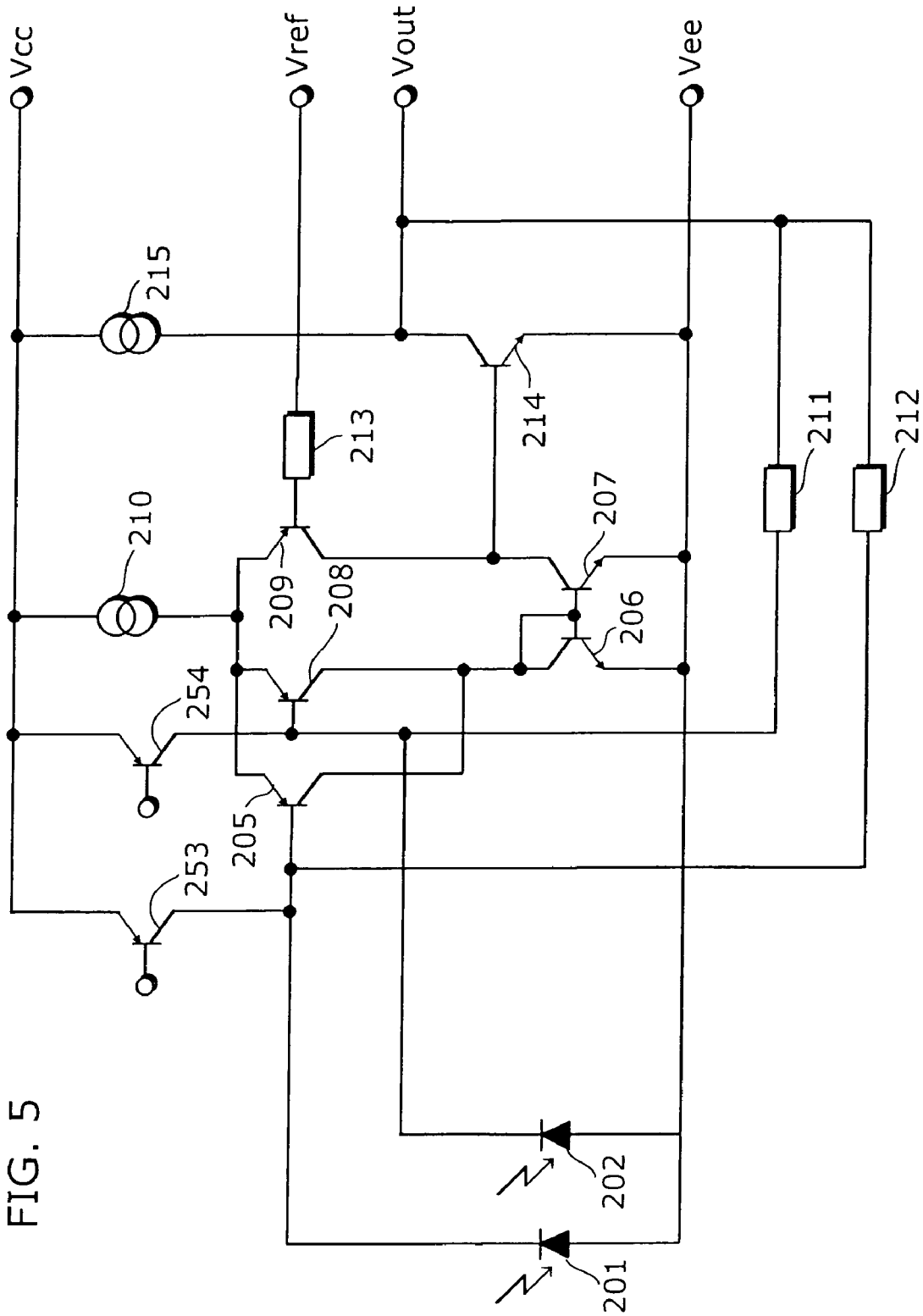
FIG. 5 is a circuit diagram showing an example of a photocurrent amplifier circuit of the second embodiment.

FIG. 5 is a circuit diagram showing an example of a photocurrent amplifier circuit like this. This photocurrent amplifier circuit is the circuit in which the respective device selector switches 203 and 204 in a photocurrent amplifier circuit (refer to FIG. 3) of the first embodiment are realized as PNP transistors 253 and 254.

Here, it is possible to switch the states of the NPN transistors 105 and 108 between an inactivated state and an active state by controlling at least one of the current to be pulled from and the voltage to be applied to the PNP transistors 253 and 254 which are respectively associated with the PNP transistors 205 and 208.

Third Embodiment

Figure 6:
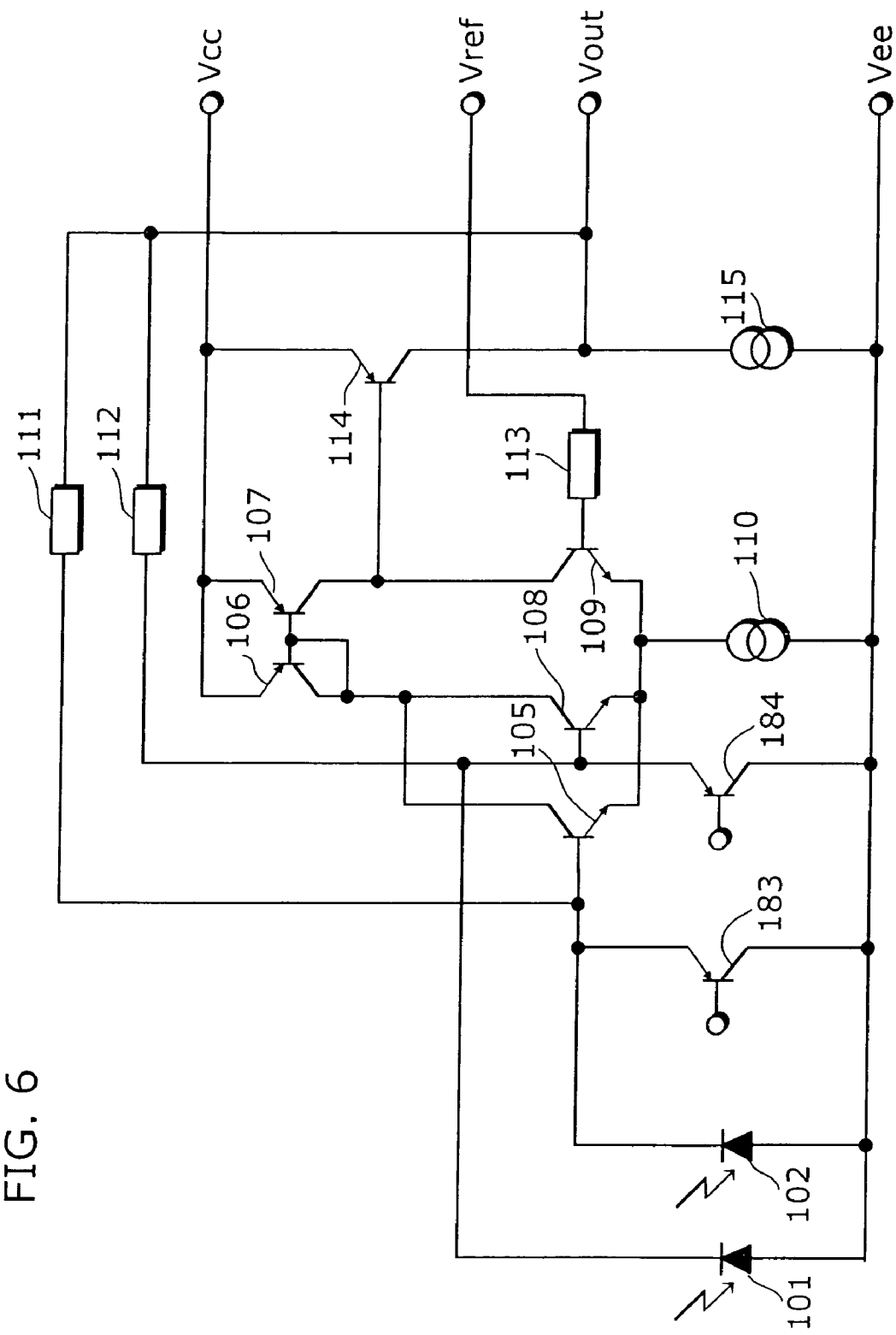
FIG. 6 is a circuit diagram showing an example of a photocurrent amplifier circuit of a third embodiment.

FIG. 6 is a circuit diagram showing an example of a photocurrent amplifier circuit of a third embodiment of the present invention.

This photocurrent amplifier circuit is the one in which the respective device selector switches 103 and 104 in the photocurrent amplifier circuit (refer to FIG. 1) of the first embodiment are realized as PNP transistors 183 and 184.

Here, it is possible to switch the states of the NPN transistors 105 and 108 between an inactivated state and an active state by controlling at least one of the current to be pulled from and the voltage to be applied to the PNP transistors 183 and 184 which are respectively associated with the NPN transistors 105 and 108.

In order to inactivate the NPN transistor 105 in accordance with the base current to be pulled from the PNP transistor 183, it is required to pull a base current which causes such emitter current that triggers a voltage drop which occurs in the gain resistance 111, which results in making the emitter voltage (that is, the base voltage of the NPN transistor 105) lower than the emitter voltage of the NPN transistor 105. Note that the voltage lower than the emitter voltage of the NPN transistor 105 is an example of an input voltage which inactivates the NPN transistor 105.

In addition, in order to activate the NPN transistor 105, it is required to pull, from the PNP transistor 183, the base current which causes such emitter current which is enough to prevent the emitter voltage of the PNP transistor 183 from becoming lower than the emitter voltage of the NPN transistor 105. At this time, a specific value of the base current may be determined as, for example, 0A or below (in other words, the base current is pulled or not flowed.

On the other hand, in order to inactivate the NPN transistor 105 in accordance with the base voltage to be applied to the PNP transistor 183, it is required to apply the base voltage which makes the emitter voltage of the PNP transistor 183 lower than the emitter voltage of the NPN transistor 105.

Considering that the value obtained by adding the base-emitter voltage to the base voltage becomes the value of the emitter voltage, a specific base voltage of the PNP transistor 183 at this time may be determined as having a value which is lower than the value obtained by subtracting the base-emitter voltage of the PNP transistor 183 from the emitter voltage of the NPN transistor 105.

In addition, in order to activate the NPN transistor 105, it is required to apply a base voltage which is enough to prevent the emitter voltage of the PNP transistor 183 from becoming lower than the emitter voltage of the NPN transistor 105.

Note that it is obvious that there is the same relationship between the PNP transistor 184 and the NPN transistor 108.

In addition, the photocurrent amplifier circuit having the same features can also be configured by exchanging the NPN transistor and the PNP transistor.

Figure 7:
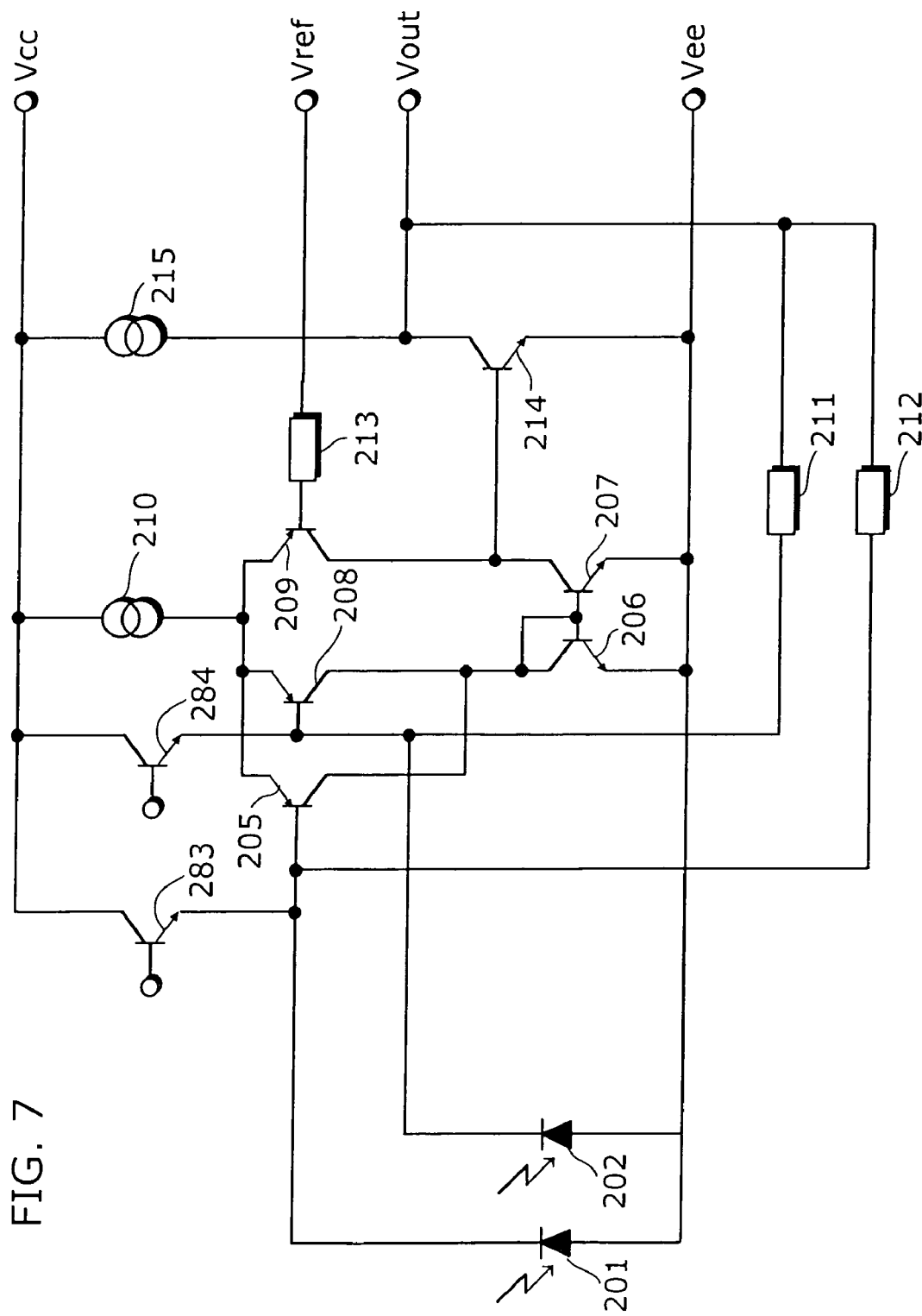
FIG. 7 is a circuit diagram showing an example of a photocurrent amplifier circuit of the third embodiment.

FIG. 7 is a circuit diagram showing an example of a photocurrent amplifier circuit like this. This photocurrent amplifier circuit is the one in which the respective device selector switches 203 and 204 in a photocurrent amplifier circuit (refer to FIG. 3) of the first embodiment are realized as the NPN transistors 283 and 284.

Here, it is possible to switch the states of the PNP transistors 205 and 208 between an inactivated state and an active state by controlling at least one of the current to be injected and the voltage to be applied to the bases of the NPN transistors 283 and 284.

Fourth Embodiment

Figure 8:
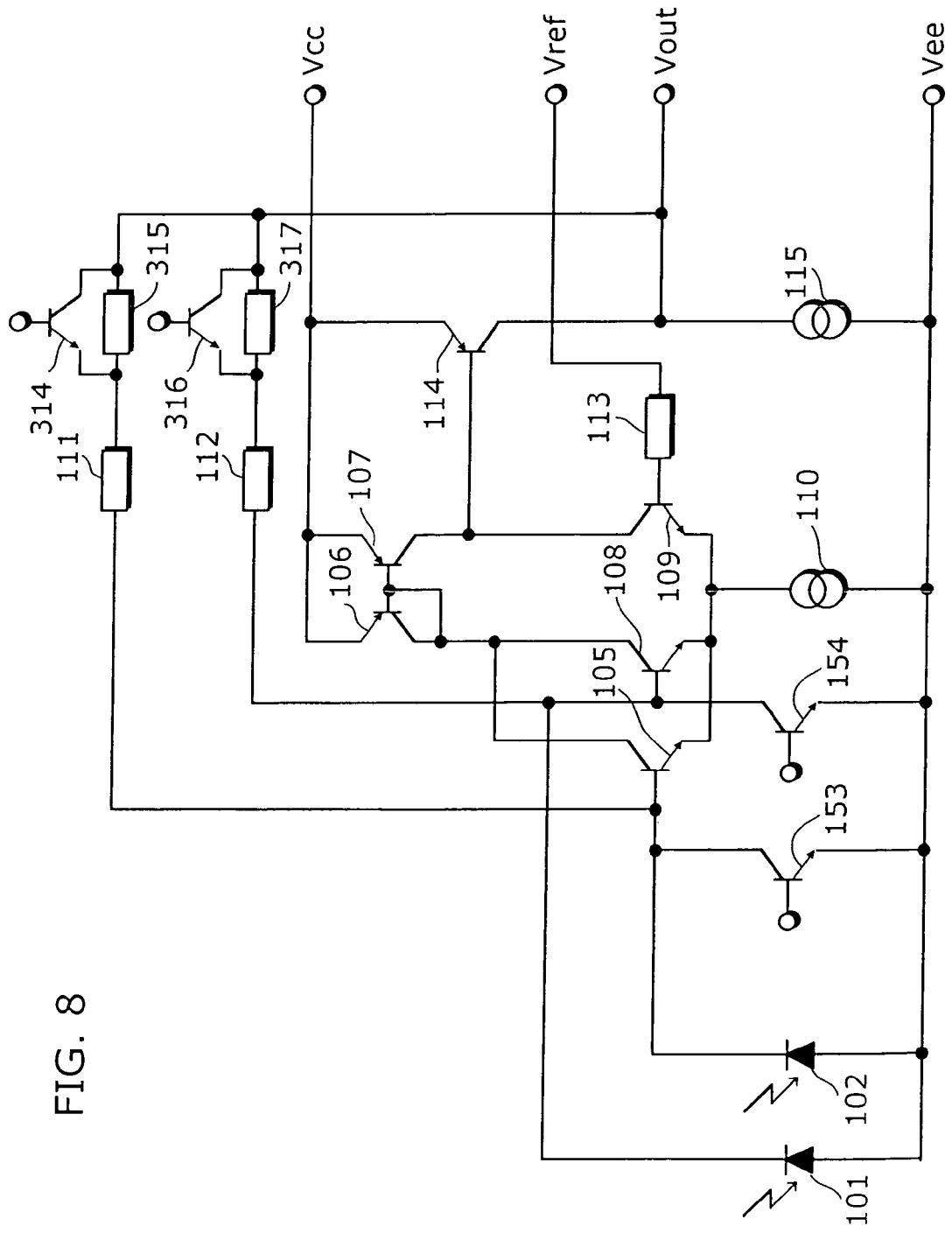
FIG. 8 is a circuit diagram showing an example of a photocurrent amplifier circuit of a fourth embodiment.

FIG. 8 is a circuit diagram showing an example of a photocurrent amplifier circuit of a fourth embodiment.

This photocurrent amplifier circuit is configured by inserting, in series with the gain resistor 111, a load control circuit made up of the load resistance 315 and the load short switch 314 which are connected in parallel into each negative feedback circuit of the photocurrent amplifier circuit (refer to FIG. 4) of the second embodiment and by inserting, in series with the gain resistor 112, a load control circuit made up of the load resistor 317 and the load short switch 316 which are connected in parallel. In this example, the respective load short switches 314 and 316 are realized as NPN transistors.

In the case where the NPN transistors 105 and 108 are inactivated, considering that the gain resistors 111 and 112 associated with the NPN transistors 105 and 108 function as internal load resistors, it is desirable that the resistance values are big as much as possible.

However, as described above, the gain resistors 111 and 112 are determined to have such resistance values that can provide favorable amplification rates for the photocurrents. Therefore, in the case where no big amplification rates are required when, for example, the light receiving devices 102 and 101 receive high-output laser light for writing, the resistance values of the gain resistors 111 and 112 are determined as comparatively small values.

Thus, in the case where the NPN transistors 105 and 108 are active and are performing amplification operations, the photocurrents are amplified at desired amplification rates by short-circuiting the load short switches 314 and 316 associated with the NPN transistors 105 and 108 and configuring a negative feedback circuit by substantially using the gain resistors only. In addition, in the case where the NPN transistors 105 and 108 are inactivated, the internal load resistances are kept high by opening the load short switches 314 and 316 associated with the NPN transistors 105 and 108 and by inserting the load resistors into the negative feedback circuit. In this way, it is possible to realize both accurate amplification rates and low output loss.

It is desirable that the resistance values of the load resistors 315 and 317 are big as much as possible for the use. For example, it is desirable that they are greater than the values of the gain resistors 111 and 112 associated with the load resistors 315 and 317.

In addition, on a semiconductor chip, it is desirable that the widths of the load resistors 315 and 317 are wider than the widths of the gain resistors 111 and 112 which are respectively connected to the load resistors 315 and 317 in series.

In general, a resistor formed on a semiconductor chip has a nature that the parasitic capacity becomes smaller but the resistance value becomes difficult to be accurate, as the width gets narrower. Therefore, generating a narrow load resistor whose accuracy requirement is comparatively low compared with that of a gain resistor which requires a high accuracy requirement makes it easier to obtain both a reduction in the parasitic capacity and accuracy in the resistance value.

In addition, it is desirable that the value obtainable by addition of the resistance value of the load resistor 315 and the resistance value of the gain resistor 111 is equal to the value obtainable by addition of the resistance value of the load resistor 317 and the resistance value of the gain resistor 112.

If so, the internal output loss can be kept constant irrespective of whether the NPN transistor 105 or whether the NPN transistor 108 is performing an amplification operation. Therefore, designing of a circuit for external connection can be streamlined.

Note that it is possible to configure a photocurrent amplifier circuit having the same features also by exchanging the NPN transistors and the PNP transistors, in the same manner as the first to third embodiments.

Fifth Embodiment

Figure 9:
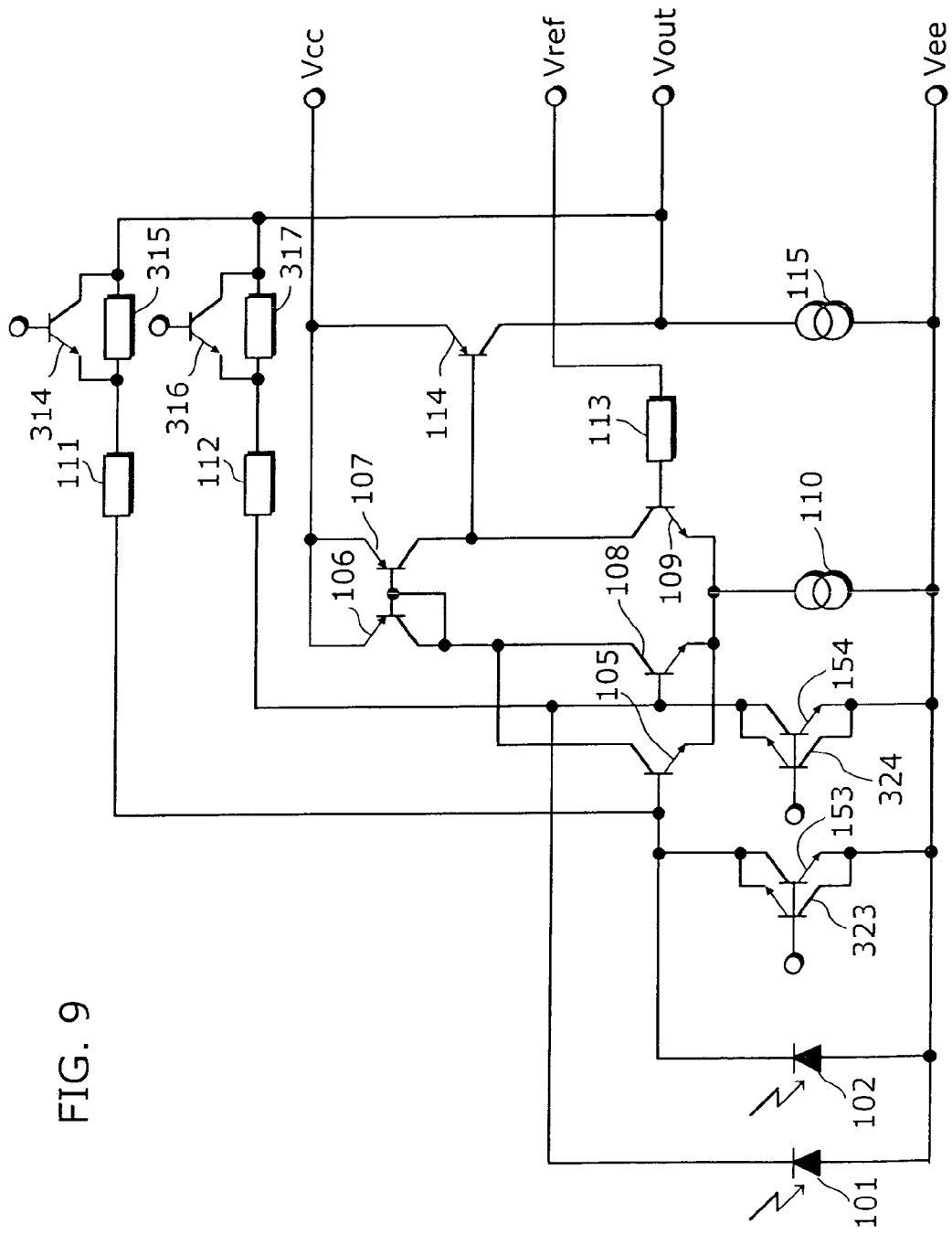
FIG. 9 is a circuit diagram showing an example of a photocurrent amplifier circuit of a fifth embodiment.

FIG. 9 is a circuit diagram showing an example of a photocurrent amplifier circuit of a fifth embodiment.

This photocurrent amplifier circuit is configured by adding photocurrent short switches 323 and 324 to both the ends of the respective light receiving devices 102 and 101 of the photocurrent amplifier circuit (refer to FIG. 8) of the fourth embodiment. In this example, the respective photocurrent short switches 323 and 324 are realized as NPN transistors.

The emitter and collector of the photocurrent short switch 323 are respectively connected to the collector and emitter of the NPN transistor 153, and the photocurrent short switch 323 and the NPN transistor 153 are connected to have a common base.

During the period when the photocurrent from the light receiving device 102 is not an amplification target, the NPN transistor 153 is turned on, the load short switch 314 is turned off, and the photocurrent short switch 323 is turned on. The photocurrent from the light receiving device 102 flows into the photocurrent short switch 323 without passing through the negative feedback circuit.

This eliminates a change in output voltage which occurs when the photocurrent which is not an amplification target passes through the gain resistance 111 and the load resistance 315, and flows from the outputs. Therefore, a highly accurate output voltage can be obtained.

During the period when the photocurrent from the light receiving device 102 is an amplification target, the NPN transistor 153 is turned off, the load short switch 314 is turned on, and the photocurrent short switch 323 is turned off. The photocurrent from the light receiving device 102 flows from the output through the negative feedback circuit to be amplified.

Note that it is obvious that there is the same relationship between the NPN transistor 154, the load short switch 316, and the photocurrent short switch 324.

In addition, it is possible to configure a photocurrent amplifier circuit having the same features also by exchanging the NPN transistor and the PNP transistor, in the same manner as the first to third embodiments.

Sixth Embodiment

Figure 10:
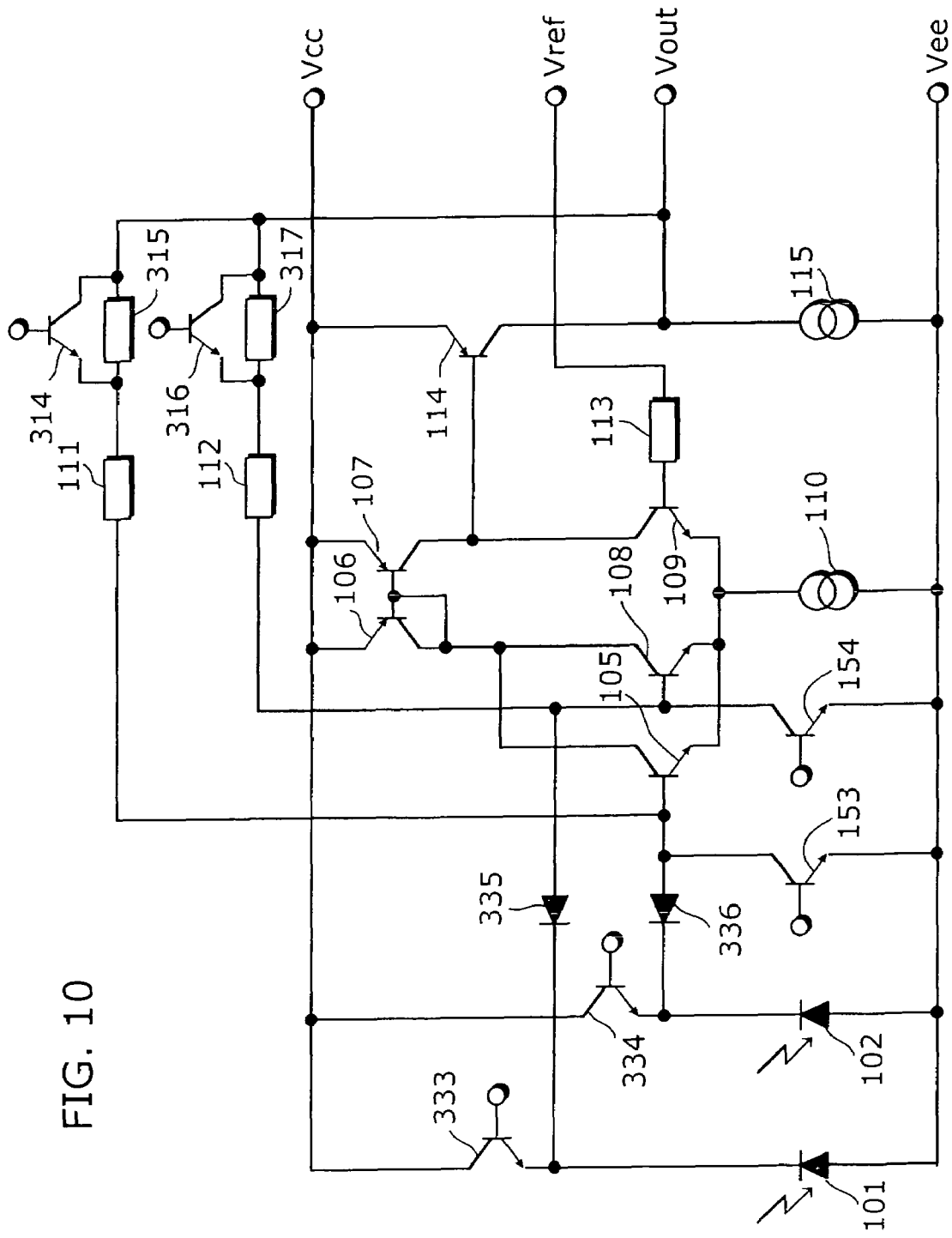
FIG. 10 is a circuit diagram showing an example of a photocurrent amplifier circuit of a sixth embodiment

FIG. 10 is a circuit diagram showing an example of a photocurrent amplifier circuit of a sixth embodiment of the present invention.

This photocurrent amplifier circuit is configured by inserting the following into the photocurrent amplifier circuit (refer to FIG. 8) of the fourth embodiment: a photocurrent supply switch 333 between the light receiving device 101 and the positive power voltage $V_{cc}$; a diode (rectifier device) 335 between (a) the connection point of the light receiving device 101 and the photocurrent supply switch 333 and (b) the base of the NPN transistor 108; a photocurrent supply switch 334 between the light receiving device 102 and the positive power voltage $V_{cc}$; and a diode (rectifier device) 336 between (a) the connection point of the light receiving device 102 and the photocurrent supply switch 334 and (b) the base of the NPN transistor 105. The diodes 335 and 336 are inserted so that the photocurrents to be supplied from the photocurrent supply switches 333 and 334 flow in the reverse direction.

Here, the bases of the NPN transistors 108 and 105 which respectively associated with the light receiving devices 101 and 102 are examples of inputs of the associated amplification devices described in the Claims of the present invention.

During the period when the photocurrent from the light receiving device 102 is not an amplification target, the NPN transistor 153 is turned on, the load short switch 314 is turned off, and the photocurrent short switch 334 is turned on. The photocurrent from the light receiving device 102 flows from the photocurrent supply switch 334 without passing through the negative feedback circuit.

This eliminates a change in output voltage which occurs when the photocurrent which is not an amplification target passes through the gain resistor 111 and the load resistor 315, and flows is from the outputs. Therefore, a highly accurate output voltage can be obtained.

Here, it should be noted that the photocurrent supply switch 334 is required to be turned on using a base voltage which keeps the emitter voltage high enough to prevent the diode 336 from coming to have a forward bias. This is because, when the diode 336 comes to have a forward bias, the photocurrent which is not to be an amplification target flows through the negative feedback circuit.

During the period when the photocurrent from the light receiving device 102 is an amplification target, the NPN transistor 153 is turned off, the load short switch 314 is turned on, and the photocurrent supply switch 334 is turned off. The photocurrent of the light receiving device 102 flows from the output through the negative feedback circuit to be amplified.

Note that it is obvious that there is the same relationship between the NPN transistor 154, the load short switch 316, and the photocurrent supply switch 334.

In addition, it is possible to configure a photocurrent amplifier circuit having the same features also by exchanging the NPN transistor and the PNP transistor, in the same manner as the first to third embodiments.

(Variation)

The earlier descriptions have been provided assuming that the number of light receiving devices is two for convenience, but of course, the circuit may be configured to have three or more light receiving devices which respectively have device selector switches. Also in this case, it is possible to obtain such photocurrent amplifier circuit that selectively amplifies, by a single differential amplifier circuit, only the photocurrent associated with the amplifier device is which has not been subjected to application of an input voltage to inactivate the amplifier device.

The elements required for each light receiving device are the amplifier device of the inverting input unit of the differential amplifier circuit and the device selector switch only. Therefore, the effect of keeping a circuit size small is remarkably exercised as the number of the light receiving devices increases.

For example, the configuration having three light receiving devices is suitable for realizing a simple and downsized three-wavelength optical pick-up device which is compliant not only with CDs and DVDs but also with BDs capable of recording and reading, using blue-violet laser light, information requiring a capacity larger than those required for CDs and DVDs. Thus, the configuration is highly practical.

In addition, in the earlier descriptions, an application of the present invention as an optical pick-up device has been described as an example providing a remarkable downsizing effect. However, of course, the photocurrent amplifier circuit of the present invention can be widely used as an amplifier circuit which selectively amplifies one or more photocurrents which are obtainable from light receiving devices, in addition to as an optical pick-up device. Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

A photocurrent amplifier circuit of the present invention can be widely used as an amplifier circuit which selectively amplifies one or more photocurrents which are respectively obtainable from plurality of light receiving devices. In particular, the present invention is suitable for use in a light receiving unit in a simple and downsized optical pick-up device which is capable of information reading and/or writing, from and/or onto plural kinds of optical disc media, using plural lights with different wavelengths.

What is claimed is:

1. A photocurrent amplifier circuit comprising:
   a differential amplifier circuit which is configured to have an input unit including amplifier devices which are connected in parallel;
   device selector switches, each of which is connected to an input of an associated one of said amplifier devices and is operable to apply an input voltage to said associated amplifier device, the input voltage inactivating said associated amplifier device;
   gain resistors, each of which is connected between an input of an associated one of said amplifier devices and an output of said differential amplifier circuit; and
   light receiving devices, each of which is connected to an input of an associated one of said amplifier devices and is operable to cause a photocurrent in accordance with an amount of received light,
   wherein the photocurrent flowing from each of the light receiving devices into an associated one of said gain resistors is amplified into a voltage signal by said differential amplifier circuit.

2. The photocurrent amplifier circuit according to claim 1, further comprising
   load control circuits, each of which is configured to have a load resistor and a load short switch connected in parallel to each other, each of said load control circuits being connected in series with an associated one of said gain resistors and being set between the output of said differential amplifier circuit and the input of an associated one of said amplifier devices.

3. The photocurrent amplifier circuit according to claim 2, wherein each of said load resistors has a resistance value greater than a resistance value of said gain resistor which is connected in series with said load resistor.

4. The photocurrent amplifier circuit according to claim 2, wherein each of said load resistors and each of said gain resistors are formed on a semiconductor chip, and
   wherein a width of each of said load resistors is less than a width of said gain resistor connected in series with said load resistor.

5. The photocurrent amplifier circuit according to claim 2, wherein, in each connection of said load control circuit and said gain resistor, a same value is obtainable through addition of a resistance value of said load resistor and a resistance value of said gain resistor, said gain resistor being connected in series with said load resistor.

6. The photocurrent amplifier circuit according to claim 1, further comprising:
   photocurrent supply switches, each of which is connected between (a) an associated one of said light receiving devices and (b) one of a power source and a ground; and
   rectifier devices, each of which is connected between (a) a connection point of an associated one of said light receiving devices and one of said photocurrent supply switches and (b) the input of said amplifier device associated with said light receiving device so that said rectifier device is connected in a reverse direction with respect to a photocurrent to be supplied from said photocurrent supply switch.

7. A differential amplifier circuit comprising:
   an input unit including amplifier devices which are connected in parallel; and
   device selector switches, each of which is connected to an input of an associated one of said amplifier devices and is operable to apply an input voltage to said associated amplifier device, the input voltage inactivating said associated amplifier device.

8. An optical pick-up device which is capable of (a) reading information from or (b) reading information from and writing onto plural types of optical disc media by using lights having different wavelengths, said optical pick-up device comprising a photocurrent amplifier circuit which includes:
   a differential amplifier circuit which is configured to have an input unit including amplifier devices which are connected in parallel;

device selector switches, each of which is connected to an input of an associated one of said amplifier devices and is operable to apply an input voltage to said associated amplifier device, the input voltage inactivating said associated amplifier device;

gain resistors each of which is connected between an input of an associated one of said amplifier devices and an output of said differential amplifier circuit; and light receiving devices, each of which is connected to an input of an associated one of said amplifier devices and is operable to cause a photocurrent in accordance with an amount of received light, wherein the photocurrent flowing from each of said light receiving devices into an associated one of said gain resistors is amplified into a voltage signal by said differential amplifier circuit, and wherein said light receiving devices in said photocurrent amplifier circuit receive the lights having different wavelengths.

* * * * *